Sept. 16, 1969 JIRO KASUGA ET AL 3,467,872
AUTOMATIC FREQUENCY SWEEP APPARATUS
Filed Nov. 19, 1965
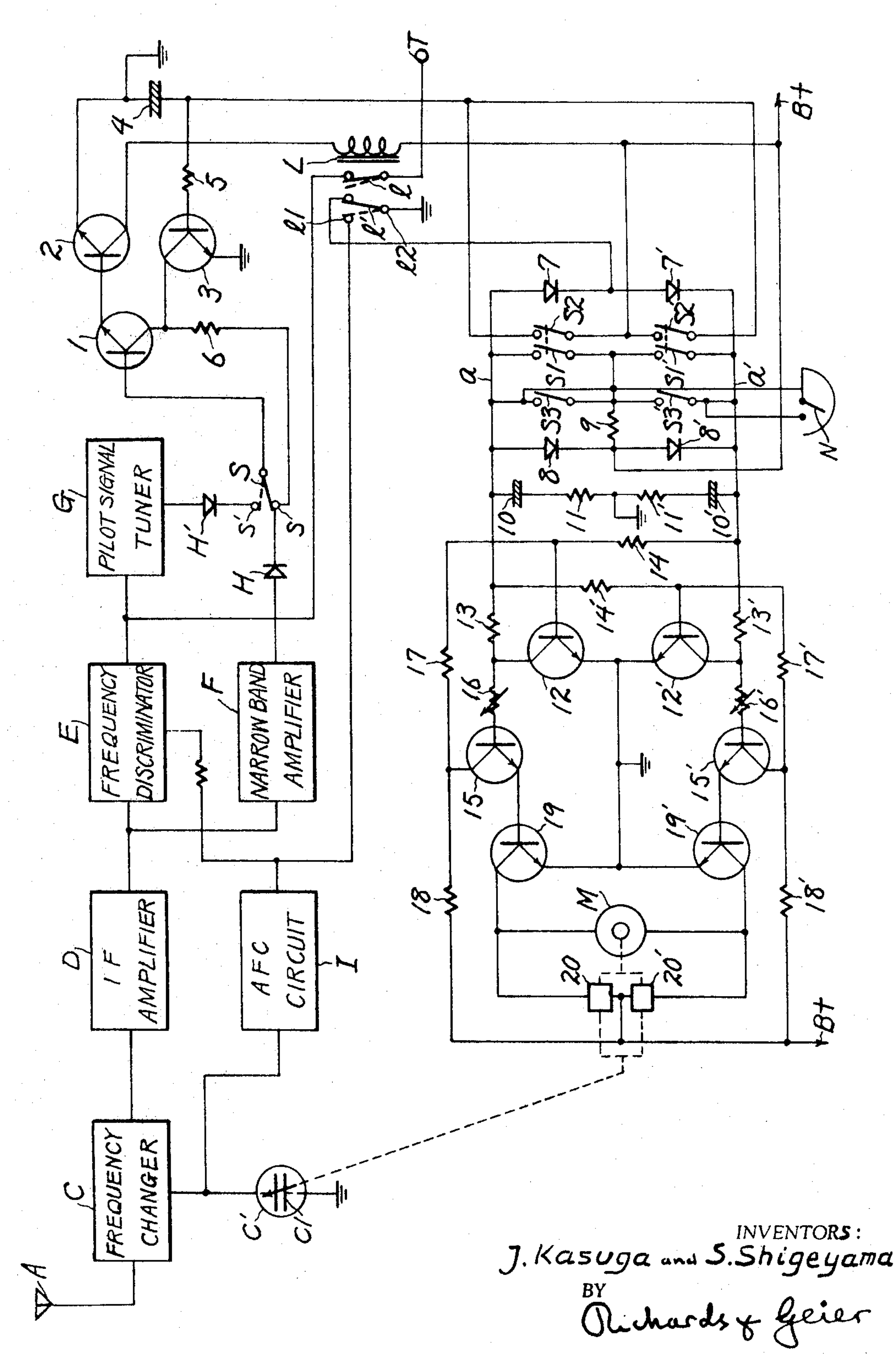
INVENTORS:
J. Kasuga and S. Shigeyama
BY
Richards & Geier
ATTORNEYS 3,467,872

AUTOMATIC FREQUENCY SWEEP APPARATUS

Jiro Kasuga, Tokyo, and Shogo Shigeyama, Yokohama-shi, Japan, assignors to Trio Corporation, Tokyo, Japan, a limited-liability company of Japan Filed Nov. 19, 1965, Ser. No. 508,657
Claims priority, application Japan, July 27, 1965, 40/45,429
Int. Cl. H04b *1/32*
U.S. Cl. 325—471 2 Claims

ABSTRACT OF THE DISCLOSURE

The automatic frequency sweep apparatus includes a pair of gang switches. Each of these switches is adapted to charge a large capacity condenser and a separate one of a pair of condensers. A signal is received and rectified and is adapted to influence two transistors. The large capacity condenser influences a control transistor. A relay is influenced by all of these transistors and is adapted to close an output circuit and to discharge said pair of condensers. The apparatus further includes a pair of control transistors each of which is influenced by a separate one of said condensers. Two further pairs of transistors are provided, each pair being influenced by a separate one of said condensers. The last-mentioned pairs of transistors control a motor which turns a variable condenser in order to sweep a frequency band.

This invention relates to automatic station selecting radio receivers, and particularly to automatic frequency sweep apparatus thereof.

In automatic station selecting radio receivers, automatic frequency sweep apparatus, in which a variable condenser in a frequency changer is turned by a motor to sweep a frequency band in order to obtain a tuning frequency, are well known. However, in such apparatus when there is no tuning frequency, a reciprocal sweep takes place repeatedly, thereby producing a power loss, mechanical damage, etc.

The principal object of the invention is to remove such defects.

An automatic frequency sweep apparatus according to the invention comprises a pair of gang switches, each of which is adapted to charge a large capacity condenser and one of a pair of condensers, a pair of switches, each of which is adapted to charge one of said pair of condensers under influence of a dialing needle at one end of a dial scale, transistors influenced by a received and rectified signal, a control transistor influenced by said large capacity condenser, a relay which is influenced by all of said transistors and adapted to close the output circuit and discharge said pair of condensers, a pair of transistors, each of which is influenced by the other of said pair of condensers, and two pairs of transistors, each pair of which are influenced by one of said pair of condensers and adapted to control a motor for turning a variable condenser in order to sweep a frequency band.

The chief features and advantages of the invention are as follows:

(1) Even after starting of frequency sweep in one direction, said sweep can be readily returned to another direction.

(2) When no tuning frequency is obtained, frequency sweep in one direction is automatically returned, and said return sweep stops before reaching the end.

(3) Although a received signal is strong, detuning takes place surely.

(4) No noise reaches the output terminal during frequency sweep.

Other more specific features and advantages will become apparent from the following description.

The sole figure of the accompanying drawing shows a block and connection diagram of an embodiment of the invention.

Referring to the figure, a low frequency signal as sound is extracted at an output terminal T from high frequency waves, which are received by an antenna A, after passing through a frequency changer C, an intermediate frequency amplifier D, a frequency discriminator E and a closed armature *l* of a relay L. Connected with the connection point of the amplifier D and the discriminator E is a narrow band amplifier F, and connected with the output side of said discriminator is a pilot signal tuner G, said amplifier F and said tuner G being respectively connected with contacts *s* and *s'* of a change-over switch S through diodes H and H'.

The frequency changer C includes a frequency changing part C' having a variable condenser C1, and connected with the connection point of said changer and said part is an AFC circuit I which is connected with the frequency discriminator E and a contact *l*1 of a relay L, another armature *l'* of said relay engaging another contact *l*2 and being earthed.

The change-over switch S is connected with a driver transistor 1 and then with a next stage transistor 2, the emitter of which is earthed and connected with the base of an emitter-earthed control transistor 3 through a charge-and-discharge condenser 4 of large capacity and a resistor 5. The collector of the transistor 2 is connected with an electric source B+ through an exciting coil of the relay L, and the collector of the transistor 3 is connected with the collector of the transistor 1 and the switch S through a resistor 6.

The contact *l*2 of said relay is connected with the connection point of opposing similar diodes 7 and 7' which are inserted between two parallel circuits *a* and *a'*. Inserted between said circuits are two switches S1 and S1' which are connected in series and interlocked with two switches S2 and S2', respectively, forming two gang switches, preferably of push button type. The switches S2 and S2' are connected in series, the connection point thereof being connected with the relay L and the source B+, and the other end of each of said switches is connected with the connection point of the condenser 4 and the resistor 5. Further, inserted between said circuits are two switches S3 and S3' such as micro-switches, which are connected in series and adapted to operate by influence of a dialing needle N at each end of a dial scale, the connection point thereof being connected with that of the switches S1 and S1'.

Two opposing similar diodes 8 and 8' are inserted between the circuits *a* and *a'*, and connected in series, the connection point thereof being connected with the source B+ and the connection point of the switches S3 and S3' through a resistor 9. Further, inserted between said circuits are two charge- and discharge condensers 10 and 10' which are connected in series through resistors 11 and 11', the connection point thereof being earthed.

Respectively connected with the circuits *a* and *a'* are the collectors of two emitter-earthed control transistors 12 and 12' through resistors 13 and 13', the bases of which are respectively connected with the circuits *a'* and *a* through resistors 14 and 14'. Further said collectors are respectively connected with the bases of two driver transistors 15 and 15' through variable resistors 16 and 16', the collectors of which are respectively connected with the bases of the transistors 12 and 12' through resistors 17 and 17' and the source B+ through resistors 18 and 18'.

The emitters of the transistors 15 and 15' are connected with the bases of two next stage emitter-earthed transistors 19 and 19', respectively, between the collectors of which a driving motor M is inserted. The shaft of said motor is interlocked with the variable condenser C1 by means of a pair of electro-magnetic couplers 20 and 20' of known type, exciting coils of which are inserted between the collectors of the transistors 19 and 19', and connected in series, the connection point thereof being connected with the source B+.

The operation of this embodiment of the invention is as follows:

When the change-over switch S engages the contact *s* and the gang switch S1–S2 is temporarily closed, the large capacity condenser 4 is charged by the source B+ and its charge is supplied to the base of the control transistor 3, thereby increasing its collector current, and accordingly decreasing each collector current of the transistors 1 and 2, then the excitation of the relay L is decreased, whereby the armatures *l* and *l'* move to positions indicated by dotted lines. Due to this arrangement, although a received signal is strong, detuning takes place steadily, and no noise reaches the output terminal T during the frequency sweep.

On the other hand, due to the closing of said gang switch the condenser 10 is also charged by the source B+, and its charge is supplied to the base of the driver transistor 15, thereby activating said transistor and the transistor 19, then the collector current of the latter flows through the couplers 20, 20' and the motor M from the source B+, whereby said motor starts and turns the variable condenser C1 through said couplers, thus frequency sweep takes place in the direction, for example, of higher frequency from a lower one. When the driver transistor 15 becomes active, a part of its collector current is supplied to the base of the control transistor 12, thereby promoting the discharge of the condenser 10 and the sweep operation.

If the required tuning is obtained by this sweep, DC positive current, which is produced from tuned signal through the intermediate frequency amplifier D, the narrow band amplifier F and the diode H, is supplied to the base of the transistor 1, thereby increasing each collector current of said transistor and the transistor 2, and increasing the excitation of the relay L to restore its armatures *l* and *l'* to the old positions indicated by full lines. Accordingly the required low frequency signal as sound is obtained at the output terminal T through the frequency discriminator E, and said discriminator is connected with the frequency changer C through the AFC circuit I, whereby the required frequency being is stable. On the other hand the connection point of the diodes 7 and 7' is earthed, whereby the charge of the condenser 10 is discharged through the diode 7, and said sweep comes to a stop.

Next, when the gang switch S1'–S2' is temporarily closed, the large capacity condenser 4 is charged as before, and at the same time the condenser 10' is charged. In this case the transistors 15' and 19' become active, and the collector current of the transistor 19' flows through the couplers 20, 20' and the motor M from the source B+, and the current flowing through said motor is opposite to that flowing in the case of closing the gang switch S1–S2, and therefore said motor turns the variable condenser C1 in a reverse direction, whereby frequency sweep takes place in the direction of lower frequency from a higher one.

Further, when the gang switch S1–S2 is closed shortly after closing the gang switch S1'–S2', the charge of the condenser 10 is supplied to the base of the control transistor 12' making it active, and the charge of the previously charged condenser 10' soon discharges through the collector of said transistor, and accordingly only the above mentioned operation due to the closing of the gang switch S1–S2 takes place.

In case the gang switch S1'–S2' is closed shortly after the closing of the gang switch S1–S2, a similar operation takes place. If the frequency sweep in the direction of higher frequency from the lower one comes to an end, namely a dialing needle reaches the highest frequency graduation of a dial scale, without tuning, the switch S3' is closed, thereby charging the condenser 10', then the same operation as in the case of closing the gang switch S1–S2 takes place, namely a return sweep in the direction of lower frequency from a higher one takes place. The duration of said sweep depends on a decrease of the charge supplied to the driver transistor 15', which decrease can be adjusted by the variable resistor 16'. Therefore said sweep comes to an automatic stop before reaching the lowest frequency graduation of said dial scale by adjusting said variable resistor. In the case of the frequency sweep in the direction of lower frequency from a higher one, a similar operation to the above takes place.

One reception of FM multiplex transmission including a pilot signal similar frequency sweep operations to the above can take place by changing over the switch S to the contact *s'*. In this case DC positive current, which is obtained from the pilot signal through the pilot signal tuner G and the diode H', is supplied to the driver transistor 1.

The diodes 8 and 8' serve to discharge the condensers 10 and 10', respectively, when the source B+ is cut out.

It is believed that from the above description the features and advantages of the invention will be readily apparent to those skilled in the art, and it will of course be understood that changes in details of construction may be resorted to, without departing from the spirit of the invention or the scope of the appended claims.

What we claim is:

1. An automatic frequency sweep apparatus comprising two ganged switches interconnected in series and having contacts, a large capacity condenser, conductors connecting a plate of said condenser with contacts of the two switches, two other condensers, means interconnecting one plate of each said two other condensers, a conductor connecting the other plate of one of said two other condensers with a contact of one of said two ganged switches, means connecting the other plate of the other one of said two other condensers with a contact of the other two ganged switches, two transistors, the emitter electrode of one of said transistors being connected to the base electrode of the other one of said transistors, means connected with the base electrode of said one transistor for receiving, rectifying and transmitting a signal, a control transistor having its collector electrode connected with the collector electrode of said one transistor, means connecting the base electrode of said control transistor with said plate of the large capacity condenser, a relay having an exciting coil and switches, a conductor connecting the exciting coil of said relay with the collector electrode of the second one of the two first-mentioned transistors, means connecting the switches of said relay to said signal receiving, rectifying and transmitting means, two other control transistors having interconnected emitter electrodes, means connecting the collector electrode of one of said two other control transistors with the other plate of one of said two other condensors, means connecting the collector electrode of the other one of said two other control transistors with the other plate of the other one of said two other condensers, yet another pair of transistors, the emitter electrode of one of yet another pair of transistors being connected to the base electrode of the other one of yet another pair of transistors, means connecting the base electrode of said one of yet another pair of transistors with the collector electrode of said one of the two other control transistors, a still further pair of transistors, the emitter electrode of one of the still further pair of transistors being connected to the base electrode of the other one of the still further pair of transistors, the emitter electrode of the other one of said yet another pair of transistors being connected to the emitter electrode of the other one of said still further pair of transistors, means connecting the base electrode of said one of said still further pair of transistors to the collector electrode of said other one of the two other control transistors, a motor connected to the collector electrode of the other one of yet another pair of transistors and the collector electrode of the other one of the still further pair of transistors, a variable tuning condenser, and means operatively connecting the last-mentioned condenser with said motor.

2. An automatic frequency sweep apparatus in accordance with claim 1, further comprising another pair of switches interconnected in series and having contacts connected with the contacts of said ganged switches, a conductor connecting a contact of one of said other pair of switches with a contact of one of said ganged switches, a conductor connecting a contact of the other one of said other pair of switches with a contact of the other one of said ganged switches, and dial actuated means connected with the contacts of said other pair of switches.

References Cited

UNITED STATES PATENTS

| | | | |
|---|---|---|---|
| 2,507,735 | 5/1950 | Peterson | 325—471 |
| 2,875,329 | 2/1959 | Paul | 325—471 |
| 2,977,467 | 3/1961 | Black | 325—469 |
| 2,981,836 | 4/1961 | Guyton | 325—470 |

KATHLEEN H. CLAFFY, Primary Examiner

B. P. SMITH, Assistant Examiner